(12) United States Patent
Ning et al.

(10) Patent No.: US 10,784,454 B2
(45) Date of Patent: Sep. 22, 2020

(54) METHOD FOR MAKING POLYMER SOLAR CELL

(71) Applicants: Tsinghua University, Beijing (CN); HON HAI PRECISION INDUSTRY CO., LTD., New Taipei (TW)

(72) Inventors: Wen Ning, Beijing (CN); Peng Liu, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 113 days.

(21) Appl. No.: 16/155,899

(22) Filed: Oct. 10, 2018

(65) Prior Publication Data
US 2019/0319206 A1 Oct. 17, 2019

(30) Foreign Application Priority Data
Apr. 16, 2018 (CN) .......................... 2018 1 0338165

(51) Int. Cl.
*H01L 51/42* (2006.01)
*H01L 51/44* (2006.01)
*H01L 51/00* (2006.01)

(52) U.S. Cl.
CPC ...... *H01L 51/4273* (2013.01); *H01L 51/0003* (2013.01); *H01L 51/0034* (2013.01); *H01L 51/0048* (2013.01); *H01L 51/441* (2013.01)

(58) Field of Classification Search
CPC ............... H01L 51/003; H01L 51/4273; H01L 51/0034; H01L 51/0048; H01L 51/441
See application file for complete search history.

(56) References Cited

U.S. PATENT DOCUMENTS

| 8,475,667 B2* | 7/2013 | Darnon | G03F 7/094 216/13 |
|---|---|---|---|
| 9,935,008 B2 | 4/2018 | Tateishi | |
| 2006/0057927 A1* | 3/2006 | Kang | B82Y 10/00 445/46 |
| 2009/0084436 A1* | 4/2009 | Yang | B82Y 10/00 136/256 |

(Continued)

FOREIGN PATENT DOCUMENTS

| CN | 102646745 | 8/2012 |
| TW | 200802905 | 1/2008 |
| TW | 201624738 | 7/2016 |

*Primary Examiner* — Dale E Page
*Assistant Examiner* — Quovaunda Jefferson
(74) *Attorney, Agent, or Firm* — ScienBiziP, P.C.

(57) ABSTRACT

A method for making a polymer solar cell includes the following steps: placing a portion of a carbon nanotube layer into a polymer solution, wherein the carbon nanotube layer includes a plurality of carbon nanotubes; curing the polymer solution to form a polymer layer including a first polymer surface and a second polymer surface opposite to the first polymer surface, wherein the portion of the carbon nanotube layer is embedded in the polymer layer, and another portion of the carbon nanotube layer is exposed from the polymer layer; and forming a cathode electrode on a surface of the carbon nanotube layer away from the polymer layer, and forming an anode electrode on the first polymer surface, wherein the anode electrode is spaced apart from the carbon nanotube layer.

20 Claims, 23 Drawing Sheets

(56) References Cited

U.S. PATENT DOCUMENTS

| | | | |
|---|---|---|---|
| 2011/0220191 A1* | 9/2011 | Flood | B82Y 10/00 |
| | | | 136/255 |
| 2014/0014183 A1* | 1/2014 | Maeda | H01L 51/0078 |
| | | | 136/263 |
| 2017/0365418 A1 | 12/2017 | Schumann et al. | |
| 2019/0319207 A1* | 10/2019 | Ning | H01L 51/441 |

* cited by examiner

US 10,784,454 B2

METHOD FOR MAKING POLYMER SOLAR CELL

CROSS-REFERENCE TO RELATED APPLICATIONS

This application is related to commonly-assigned applications entitled, "POLYMER SOLAR CELL", concurrently filed Ser. No. 16/155,900; "METHOD FOR MAKING POLYMER SOLAR CELL", concurrently filed Ser. No. 16/155,894; "POLYMER SOLAR CELL", concurrently filed Ser. No. 16/155,896; "METHOD FOR MAKING POLYMER SOLAR CELL", concurrently filed Ser. No. 16/155,897; "POLYMER SOLAR CELL", concurrently filed Ser. No. 16/155,898. Ser. Nos. 16/155,900 and 16/155,894 share the same specification, Ser. Nos. 16/155,896 and 16/155,897 share the same specification, and Ser. Nos. 16/155,898 and 16/155,899 share the same specification. Disclosures of the above-identified applications are incorporated herein by reference.

FIELD

The present application relates to polymer solar cells and methods for making the same.

BACKGROUND

The polymer solar cell has many advantages such as wide raw materials and low cost, and has become one of the research hotspots in recent years. When the light reaches the photoactive layer of the polymer solar cell, the photoactive layer absorbs photons of the light and generates excitons. The excitons diffuse and reach the interface between the donor and the acceptor to form electrons and holes. The electrons pass through the acceptor and reach the cathode electrode, and the holes pass through the donor and reach the anode electrode. Thus, a potential difference between the cathode electrode and the anode electrode is formed. The use of solar light is an important factor to affect the photoelectric conversion efficiency of the polymer solar cell. A common method is to increase the solar light absorption rate by changing the material of the photoactive layer.

Al-Haik et la. (US20070110977A1) discloses that a plurality of carbon nanotubes are dispersed in a polymer and then these carbon nanotubes are oriented using a magnetic field, to form a composite. The composite can be acted as a photoactive material of the polymer solar cell. However, the carbon nanotubes are covered with the polymer, and the carbon nanotubes do not directly contact with the electrodes, thereby reducing the electrical conductivity between the carbon nanotubes and the electrodes.

Therefore, there is room for improvement in the art.

BRIEF DESCRIPTION OF THE DRAWINGS

Implementations of the present technology will now be described, by way of example only, with reference to the attached figures, wherein.

DETAILED DESCRIPTION

Figure 1:
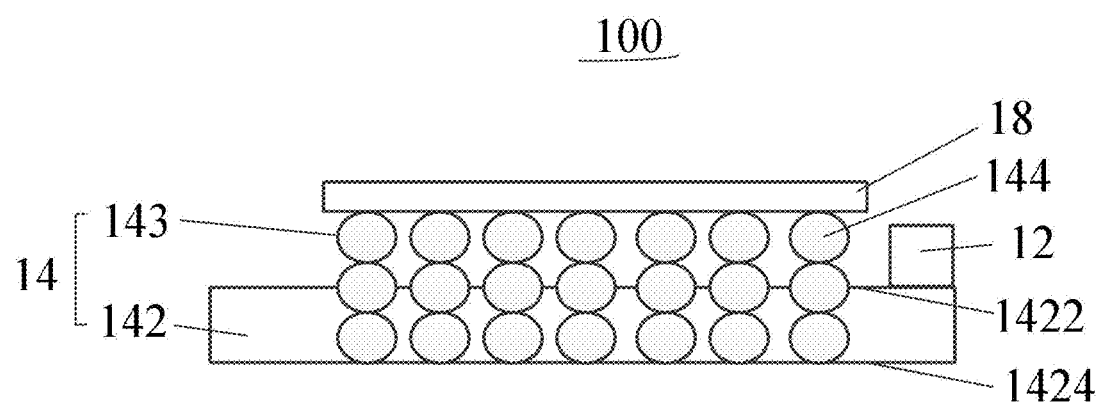
FIG. 1 schematically shows a first embodiment of a polymer solar cell.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Depending on the embodiment, certain of the steps or blocks described may be removed, others may be added, and the sequence of steps or blocks may be altered. It is also to be understood that the description and the claims drawn to a method may include some reference numeral indication referring to certain blocks or steps. However, the reference numeral indication used is only for identification purposes and not interpreted as a suggestion as to an order for the steps.

FIG. 1 shows a polymer solar cell 100 of a first embodiment and that includes an anode electrode 12, a photoactive layer 14, and a cathode electrode 18. The photoactive layer 14 includes a polymer layer 142 and a carbon nanotube layer 143. The polymer layer 142 includes a first polymer surface 1422 and a second polymer surface 1424 opposite to the first polymer surface 1422. The carbon nanotube layer 143 includes a plurality of carbon nanotubes 144. The cathode electrode 18 is located on a surface of the carbon nanotube layer 143 away from the polymer layer 142. The anode electrode 12 is located on the first polymer surface 1422 and spaced apart from the carbon nanotube layer 143.

The polymer layer 142 functions as an electron donor. The material of the polymer layer 142 can be polythiophene and its derivative, polyfluorene and its derivative, poly-phenylene vinylene and its derivative, polypyrrole and its derivative, or any combination thereof. The polythiophene derivative can be poly(3-hexylthiophene) ($P_3HT$). The polyfluorene derivative can be poly(dioctylfluorene). The polyphenylene vinylene derivative can be poly[2-methoxy-5-(2-ethyl-hexyloxy)-1,4-phenylene vinylene]. In one embodiment, the material of the polymer layer 142 is polythiophene.

The plurality of carbon nanotubes 144 functions as electron acceptors. The plurality of carbon nanotubes 144 are substantially parallel to each other. The plurality of carbon nanotubes 144 are spaced apart from each other. The length directions of the plurality of carbon nanotubes 144 substantially extend along the same direction. The length directions of the plurality of carbon nanotubes 144 are parallel to the first polymer surface 1422. Some carbon nanotubes 144 are embedded in the polymer layer 142, and the rest of carbon nanotubes 144 are exposed from the polymer layer 142. The carbon nanotubes 144 exposed from the polymer layer 142 is located on the first polymer surface 1442. The carbon nanotubes 144 can be single-walled, double-walled, multi-walled carbon nanotubes, or their combinations. The single-walled carbon nanotubes 144 have a diameter of about 0.5 nanometers (nm) to about 50 nm. The double-walled carbon nanotubes 144 have a diameter of about 1.0 nm to about 50 nm. The multi-walled carbon nanotubes 144 have a diameter of about 1.5 nm to about 50 nm. The lengths of the carbon nanotubes 144 are substantially equal. In one embodiment, the carbon nanotube layer 143 is a multi-layer stacked drawn carbon nanotube film.

There are carbon nanotubes 144 between the cathode electrode 18 and the first polymer surface 1422, thus the cathode electrode 18 is not in direct contact with the first polymer surface 1422, thereby preventing holes generated by the exciton separation from migrating from the polymer layer 142 to the cathode electrode 18. Thus, all of the holes can migrate from the polymer layer 142 to the anode electrode 12. The anode electrode 12 is spaced apart from with the carbon nanotubes 144, thereby preventing electrons generated by the exciton separation from migrating from the carbon nanotubes 144 to the anode electrode 12. Thus, all of the electrons can migrate from the carbon nanotubes 144 to the cathode electrode 18. The anode electrode 12 and the cathode electrode 18 can be a transparent conductive layer or a porous mesh structure, such as ITO (indium tin oxide) layer, FTO (F-doped tin oxide) layer, or the like. The anode electrode 12 and the cathode electrode 18 can be opaque, such as aluminum layer, silver layer, or the like.

Figure 2:
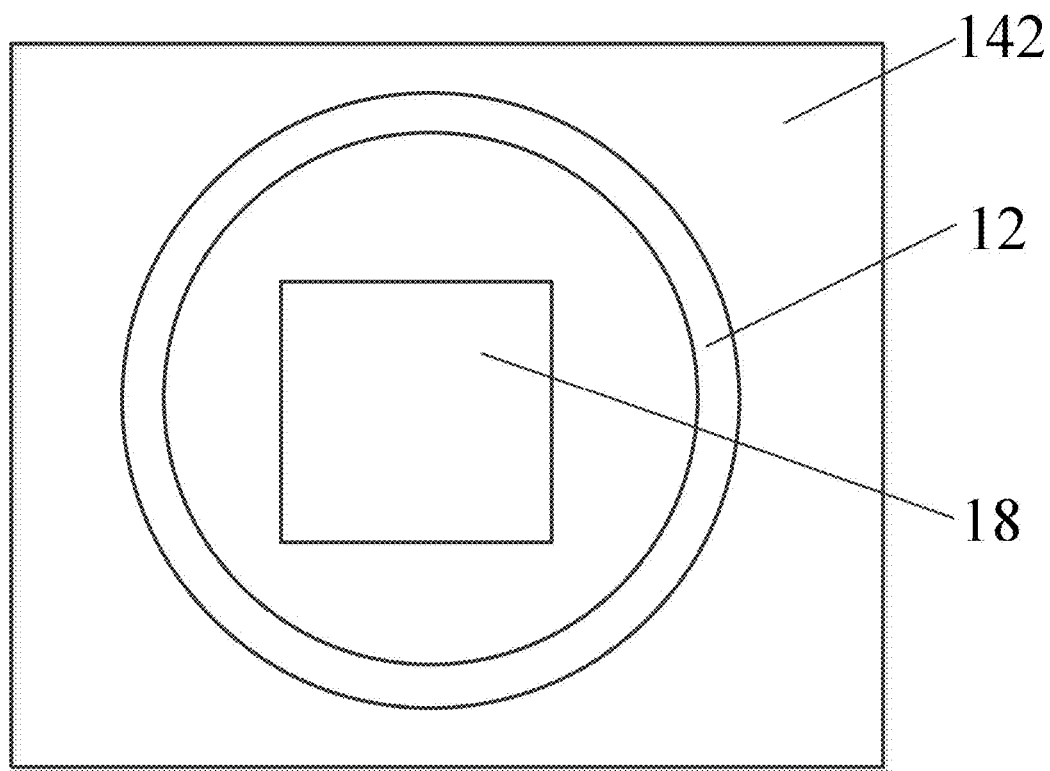
FIG. 2 schematically shows a first embodiment of another polymer solar cell.

Both the anode electrode 12 and the cathode electrode 18 are located on the same side of the polymer layer 142 (i.e., on the first polymer surface 1422). Thus light can reach the photoactive layer 14 from the second polymer surface 1424, and accordingly, the anode electrode 12 and the cathode electrode 18 do not have to be transparent. In one embodiment, light reaches the photoactive layer 14 from the second polymer surface 1424, and the materials of the anode electrode 12 and the cathode electrode 18 are aluminum. The shapes of the anode electrode 12 and the cathode electrode 18 are not limited. The larger the contact area of the cathode electrode 18 and the carbon nanotube layer 143, the faster the speed of electrons that migrate to the cathode electrode 18. The smaller the contact area of the anode electrode 12 and the first polymer surface 1422, the slower the speed of holes that migrate to the anode electrode 12. In one embodiment, the anode electrode 12 has a ring shape, such as circular ring, as shown in FIG. 2.

When any one of the anode electrode 12 and the cathode electrode 18 is a metal film, the metal film can reflect light that reaches the metal film into the photoactive layer 14, improving the utilization of light. Thus, the metal film plays a function of conducting electron and reflecting light.

Figure 3:
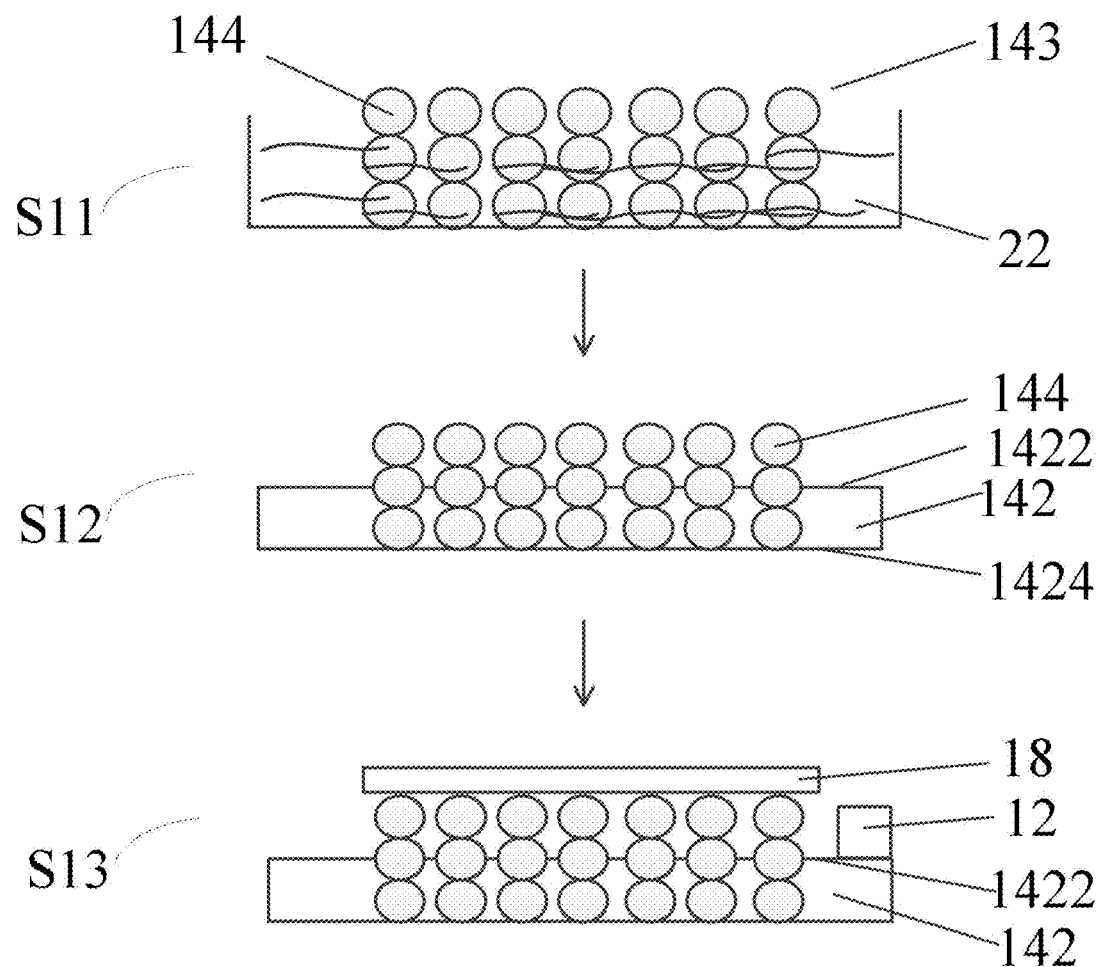
FIG. 3 is a process flow of a method for making the polymer solar cell of FIG. 1.

FIG. 3 shows the first embodiment of a method for making the polymer solar cell 100, and the method includes the following steps:

S11, placing the carbon nanotube layer 143 into a polymer solution 22, wherein the carbon nanotube layer 143 includes the plurality of carbon nanotubes 144, the length direction of each carbon nanotube 144 is parallel to the surface of the polymer solution 22, some carbon nanotubes 144 are immersed in the polymer solution 22, and some carbon nanotubes 144 are exposed from the polymer solution 22;

S12, curing the polymer solution 22 to form the polymer layer 142, wherein the polymer layer 142 includes a first polymer surface 1422 and a second polymer surface 1424 opposite to the first polymer surface 1422, the area of the first polymer surface 1422 is greater than the area of the surface of the carbon nanotube layer 143 away from the polymer layer 142, some carbon nanotubes 144 are embedded in the polymer layer 142, and some carbon nanotubes 144 are exposed from the polymer layer 142; and S13, forming the cathode electrode 18 on the surface of the carbon nanotube layer 143 away from the polymer layer 142, and forming the anode electrode 12 on the first polymer surface 1422, wherein the anode electrode 12 is spaced apart from the carbon nanotube layer 143.

In the step S11, the carbon nanotube layer 143 includes a plurality of carbon nanotube films stacked on each other.

The carbon nanotube film can be a drawn carbon nanotube film, a flocculated carbon nanotube film, or a pressed carbon nanotube film.

Figure 4:
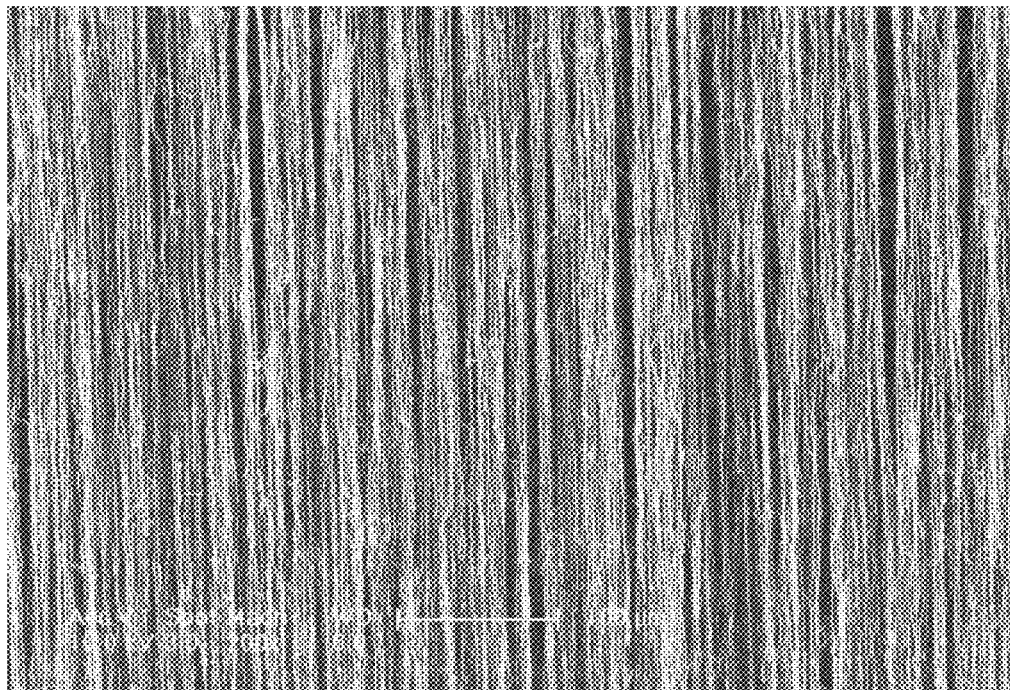
FIG. 4 is a scanning electron microscope (SEM) image of a drawn carbon nanotube film.

FIG. 4 shows the drawn carbon nanotube film and that includes the plurality of successive and oriented carbon nanotubes 144 joined end-to-end by van der Waals attractive force there between. The carbon nanotubes 144 in the drawn carbon nanotube film are oriented along a preferred orientation. The carbon nanotubes 144 are parallel to a surface of the drawn carbon nanotube film. The drawn carbon nanotube film is a free-standing film. The drawn carbon nanotube film can bend to desired shapes without breaking. A film can be drawn from a carbon nanotube array to form the drawn carbon nanotube film.

If the carbon nanotube layer 143 includes at least two stacked drawn carbon nanotube films, adjacent drawn carbon nanotube films can be combined by only the van der Waals attractive force therebetween. Additionally, when the carbon nanotubes 144 in the drawn carbon nanotube film are aligned along one preferred orientation, an angle can exist between the orientations of carbon nanotubes 144 in adjacent drawn carbon nanotube films, whether stacked or adjacent. An angle between the aligned directions of the carbon nanotubes 144 in two adjacent drawn carbon nanotube films can be in a range from about 0 degree to about 90 degrees. The number of the drawn carbon nanotube films in the carbon nanotube layer 143 can be in a range from 2 to 200. In one embodiment, the carbon nanotube layer 143 includes three layers of the drawn carbon nanotube films, and the angle between the aligned directions of the carbon nanotubes 144 in two adjacent drawn carbon nanotube films is about 90 degrees.

Figure 5:
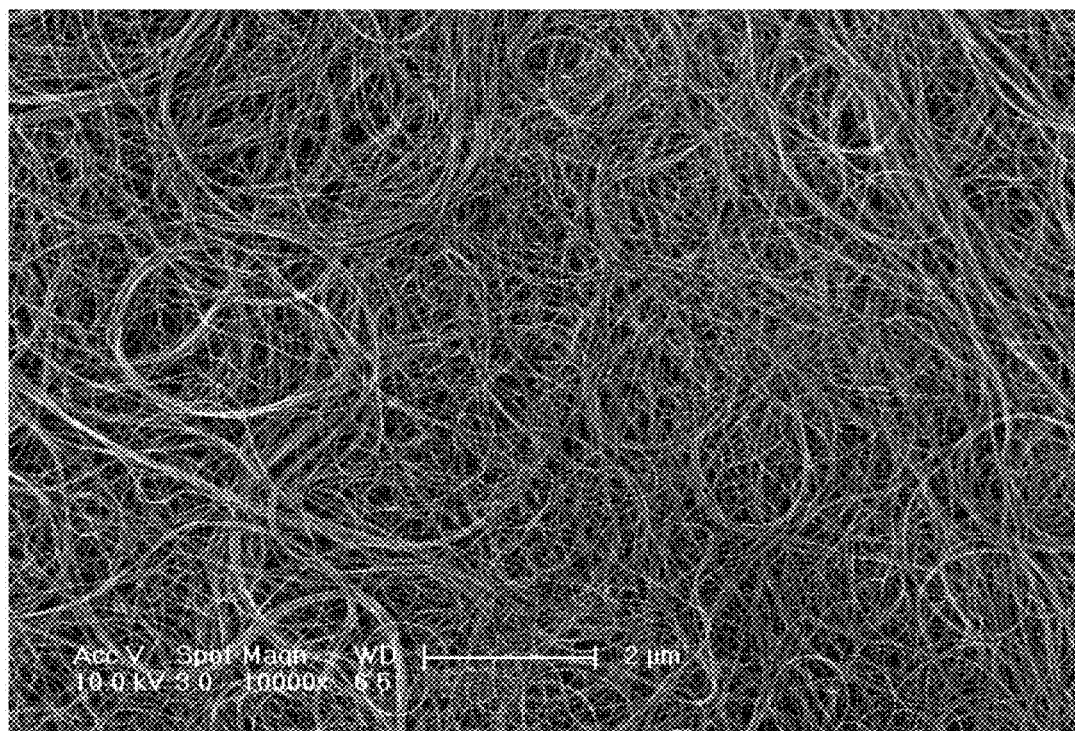
FIG. 5 is an SEM image of a flocculated carbon nanotube film.

FIG. 5 shows the flocculated carbon nanotube film and that includes a plurality of long, curved, disordered carbon nanotubes 144 entangled with each other. The flocculated carbon nanotube film can be isotropic. The carbon nanotubes 144 can be substantially uniformly dispersed in the flocculated carbon nanotube film. Adjacent carbon nanotubes 144 are acted upon by van der Waals attractive force to obtain an entangled structure. Due to the carbon nanotubes 144 in the flocculated carbon nanotube film being entangled with each other, the flocculated carbon nanotube film has excellent durability, and can be fashioned into desired shapes with a low risk to the integrity of the flocculated carbon nanotube film. Further, the flocculated carbon nanotube film is a free-standing film.

Figure 6:
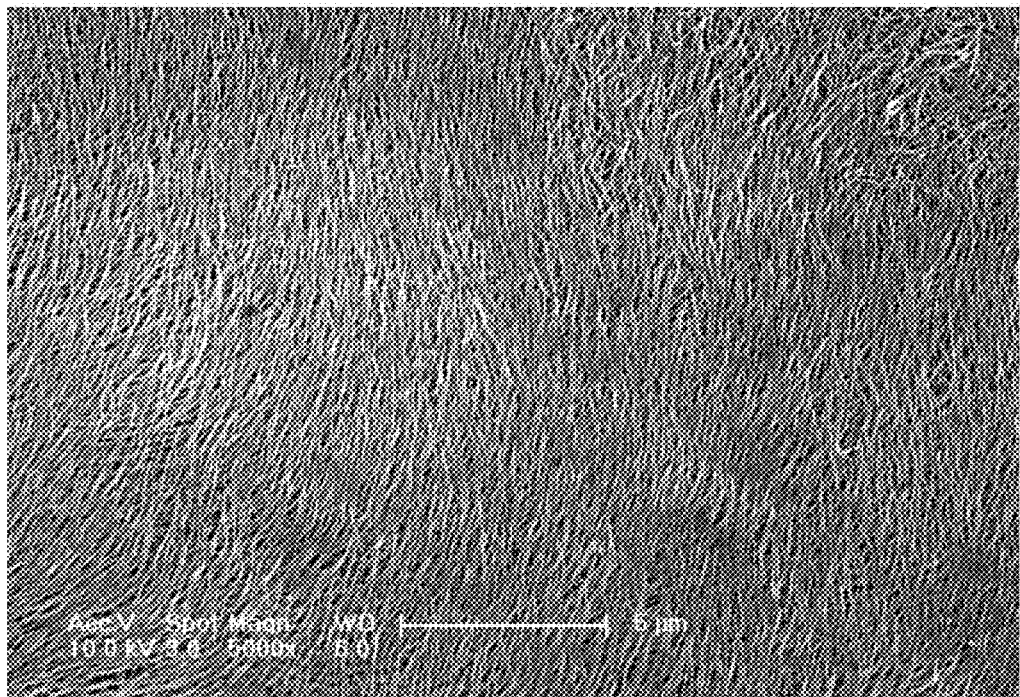
FIG. 6 is an SEM image of a pressed carbon nanotube film including a plurality of carbon nanotubes arranged along a same direction.
Figure 7:
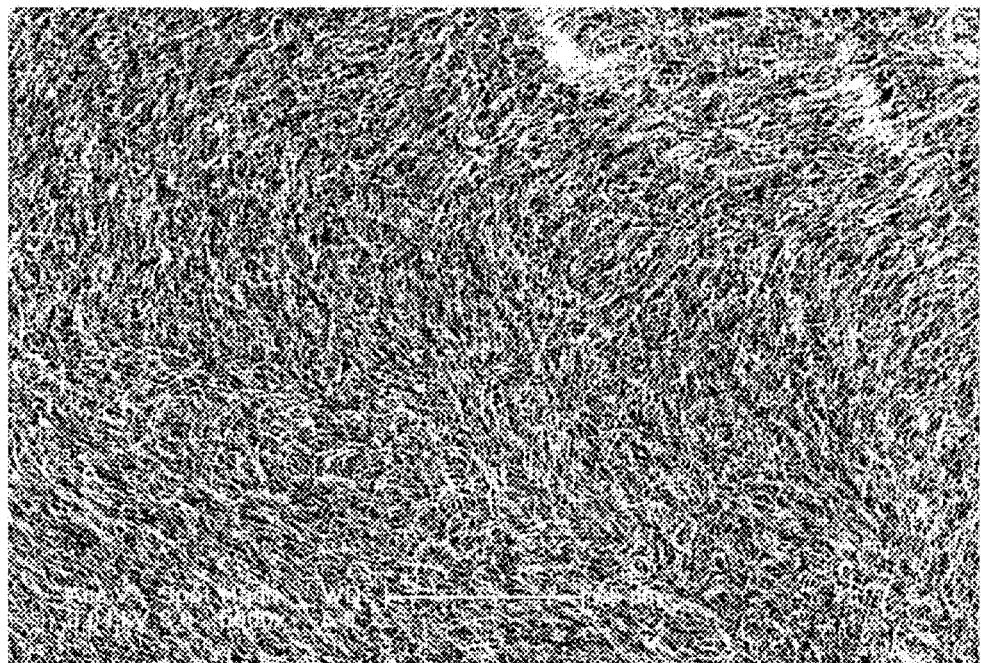
FIG. 7 is an SEM image of a pressed carbon nanotube film including a plurality of carbon nanotubes which is arranged along different direction.

FIGS. 6 and 7 show the pressed carbon nanotube film and that includes the plurality of carbon nanotubes 144. The carbon nanotubes 144 in the pressed carbon nanotube film can be arranged along a same direction, as shown in FIG. 6. The carbon nanotubes 144 in the pressed carbon nanotube film can be arranged along different directions, as shown in FIG. 7. The carbon nanotubes 144 in the pressed carbon nanotube film can rest upon each other. An angle between a primary alignment direction of the carbon nanotubes 144 and a surface of the pressed carbon nanotube film is about 0 degree to approximately 15 degrees. The greater the pressure applied, the smaller the angle obtained. If the carbon nanotubes 144 in the pressed carbon nanotube film are arranged along different directions, the pressed carbon nanotube film can have properties that are identical in all directions substantially parallel to the surface of the pressed carbon nanotube film. Adjacent carbon nanotubes 144 are attracted to each other and are joined by van der Waals attractive force. Therefore, the pressed carbon nanotube film is easy to bend to desired shapes without breaking. Further, the pressed carbon nanotube film is a free-standing film.

The term "free-standing" includes, but not limited to, the drawn carbon nanotube film, the flocculated carbon nanotube film, or the pressed carbon nanotube film that does not have to be supported by a substrate. For example, the drawn carbon nanotube film, the flocculated carbon nanotube film, or the pressed carbon nanotube film can sustain the weight of itself when it is hoisted by a portion thereof without any significant damage to its structural integrity. So, if the drawn carbon nanotube film, the flocculated carbon nanotube film, or the pressed carbon nanotube film is placed between two separate supporters, a portion of the drawn carbon nanotube film, the flocculated carbon nanotube film, or the pressed carbon nanotube film, not in contact with the two supporters, would be suspended between the two supporters and yet maintain film structural integrity.

The polymer solution 22 is formed by dispersing a polymer material in an organic solvent. The organic solvent is not limited as long as the polymer can be dissolved in the organic solvent.

In the step S12, the method for curing the polymer solution 22 is not limited, for example, polymer solution 22 is heated to form the polymer layer 142. In one embodiment, the length direction of the each carbon nanotube 144 is parallel to the first polymer surface 1422.

In the step S13, the methods for forming the cathode electrode 18 and anode electrode 12 are not limited, such as sputtering, coating, vapor deposition, or spraying. There are gaps between adjacent carbon nanotubes 144, a previously prepared cathode electrode 18, such as a metal piece, can be directly located on the surface of the carbon nanotube layer 143 away from the polymer layer 142. Thus, the material of the cathode electrode 18 do not pass through the gaps to directly contact with the polymer layer 142.

Figure 8:
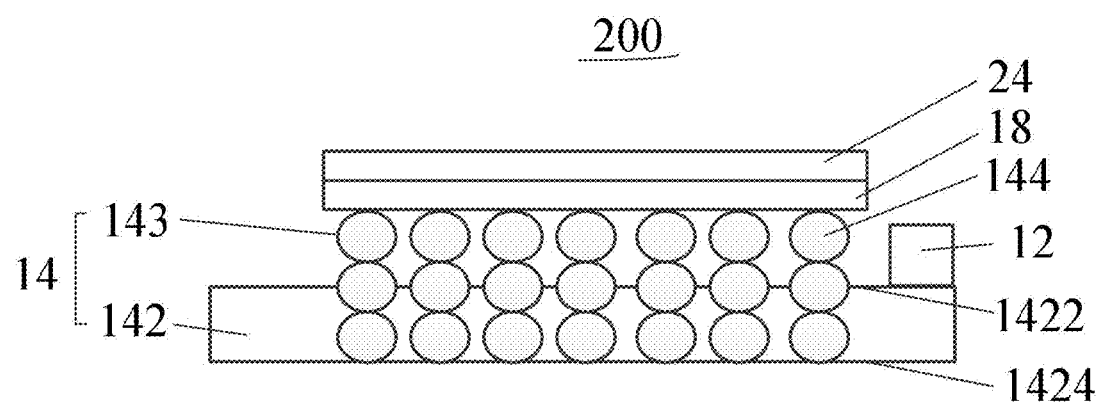
FIG. 8 schematically shows a second embodiment of a polymer solar cell.

FIG. 8 shows a polymer solar cell 200 of a second embodiment. The polymer solar cell 200 of the second embodiment is similar to the polymer solar cell 100 of the first embodiment above except that the polymer solar cell 200 further includes a reflective layer 24 located on the surface of the cathode electrode 18 away from the polymer layer 142, and the second polymer surface 1424 is the incident surface of light. When the surface of the cathode electrode 18 away from the polymer layer 142 is the incident surface of light, the reflective layer 24 is located on the second polymer surface 1424.

The function of the reflective layer 24 is: when light reaches the photoactive layer 14 from the second polymer surface 1424, part of the light that reaches the cathode electrode 18 can be reflected back into the photoactive layer 14 from the cathode electrode 18 by the reflective layer 24 located on the surface of the cathode electrode 18 away from the polymer layer 142. Thus, the utilization of light is improved. When light reaches the photoactive layer 14 from the cathode electrode 18, the lost light from the second polymer surface 1424 can be reflected back into the photoactive layer 14 by the reflective layer 24 located on the second polymer surface 1424. Thus, the utilization of light is improved. The material of the photoactive layer 14 has a high reflectivity, and the material can be, but is not limited to, a metal or metal alloy. The metal can be gold, silver, aluminum, or calcium. The metal alloy can be an alloy of calcium and aluminum, an alloy of magnesium and silver, or the like.

In the second embodiment, the method for making the polymer solar cell 200 is provided. The method for making the polymer solar cell 200 in the second embodiment is similar to the method for making the polymer solar cell 100 in the first embodiment above except that the method for making the polymer solar cell 200 further includes a step of forming the reflective layer 24. The method for forming the reflective layer 24 is not limited, such as sputtering, coating, vapor deposition, or the like.

Figure 9:
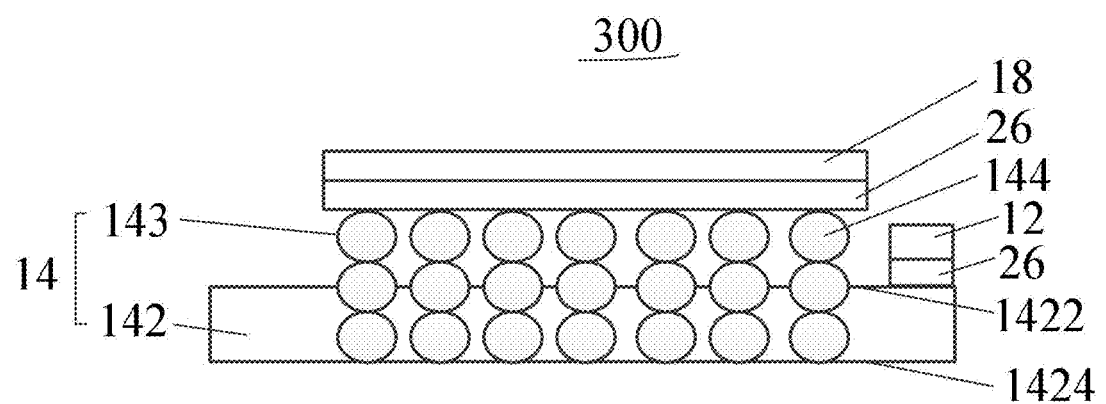
FIG. 9 schematically shows a third embodiment of a polymer solar cell.

FIG. 9 shows a polymer solar cell 300 of a third embodiment. The polymer solar cell 300 of the third embodiment is similar to the polymer solar cell 100 of the first embodiment above except that the polymer solar cell 300 further includes an exciton blocking layer 26. The exciton blocking layer 26 can be located between the polymer layer 142 and anode electrode 12. The exciton blocking layer 26 can also be located between the carbon nanotube layer 143 and the cathode electrode 18.

The function of the exciton blocking layer 26 is: light reaches the photoactive layer 14 to form excitons, and the exciton blocking layer 26 prevents the excitons from diffusing toward the cathode electrode 18 or the anode electrode 12, thereby making all excitons reach the interface between the donor and the acceptor. Thus, the utilization ratio of the excitons is improved, and accordingly the efficiency of photoelectric conversion of the polymer solar cell 300 is also improved. The material of the exciton blocking layer 26 is organic material, such as $Zn_4O(AID)_6$, $BAlQ_3$, BCP, Bphen, $Alq_3$, TAZ, or TPBI.

In the third embodiment, the method for making the polymer solar cell 300 is provided. The method for making the polymer solar cell 300 in the third embodiment is similar to the method for making the polymer solar cell 100 in the first embodiment above except that the method for making the polymer solar cell 300 further includes a step of forming the exciton blocking layer 26. After curing the polymer solution 22 and before forming the cathode electrode 18 and the anode electrode 12, the exciton blocking layer 26 is formed on the first polymer surface 1422 or the surface of the carbon nanotube layer 143 away from the polymer layer 142 by sputtering, coating, vapor deposition, or the like.

Figure 10:
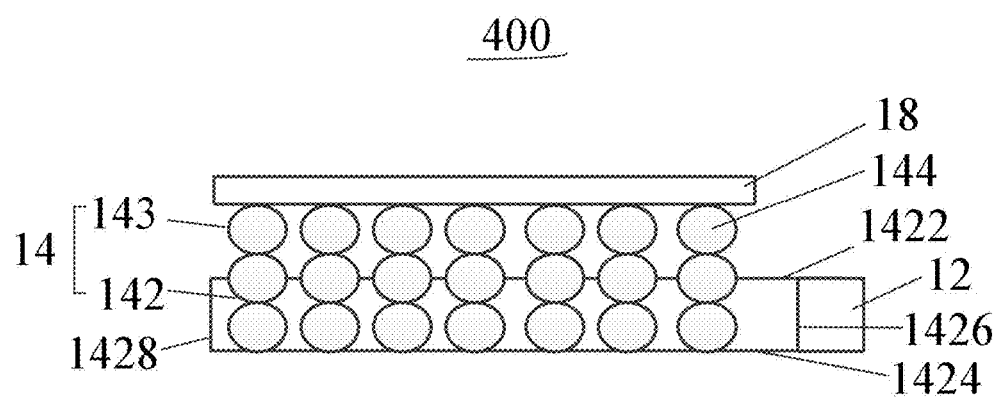
FIG. 10 schematically shows a fourth embodiment of a polymer solar cell.
Figure 11:
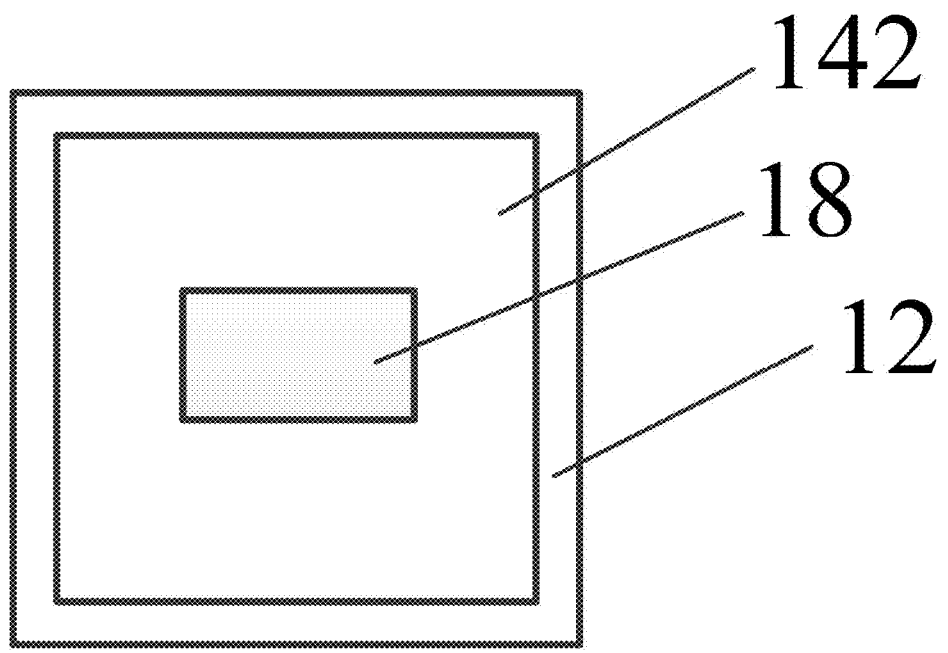
FIG. 11 schematically shows a fourth embodiment of another polymer solar cell.

FIG. 10 shows a polymer solar cell 400 of a fourth embodiment. The polymer solar cell 400 of the fourth embodiment is similar to the polymer solar cell 100 of the first embodiment above except that the positions of the anode electrodes 12. In the polymer solar cell 100, the anode electrode 12 and the cathode electrode 18 are located on the same side of the polymer layer 142 (i.e., on the first polymer surface 1422). However, in the polymer solar cell 400, the anode electrode 12 and the cathode electrode 18 are located on different sides of the polymer layer 142. The polymer layer 142 further includes a third polymer surface 1426 and a fourth polymer surface 1428, and the third polymer surface 1426 and the fourth polymer surface 1428 are connected to the first polymer surface 1422 and the second polymer surface 1424. The anode electrode 12 is located on the third polymer surface 1426 or the fourth polymer surface 1428. The anode electrode 12 can be a ring, and surround the entire side surface of the polymer layer 142, as shown in FIG. 11.

In the fourth embodiment, the method for making the polymer solar cell 400 is provided. The method for making the polymer solar cell 400 in the fourth embodiment is similar to the method for making the polymer solar cell 100 in the first embodiment above except that in the method for making the polymer solar cell 400, the anode electrode 12 is formed on the third polymer surface 1426 or the fourth polymer surface 1428.

Figure 12:
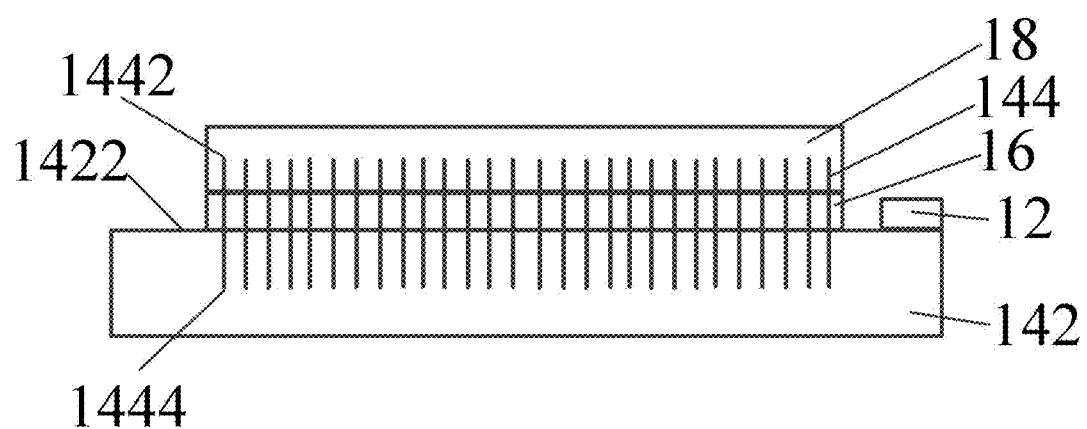
FIG. 12 schematically shows a fifth embodiment of a polymer solar cell.

FIG. 12 shows a polymer solar cell 500 of a fifth embodiment. The polymer solar cell 500 of the fifth embodiment is similar to the polymer solar cell 100 of the first embodiment above except that the polymer solar cell 500 further includes an insulating layer 16 and the length directions of the carbon nanotubes 144 are perpendicular to the first polymer surface 1422. In the polymer solar cell 500, the insulating layer 16 is located between the cathode electrode 18 and the polymer layer 142, and the insulating layer 16 is in direct contact with the cathode electrode 18 and the polymer layer 142. In the polymer solar cell 500, the carbon nanotubes 144 are exposed from the polymer layer 142, pass through the insulating layer 16, and are in direct contact with the cathode electrode 18. Each carbon nanotube 144 of the polymer solar cell 500 includes a first end 1442 and a second end 1444 opposite to the first end 1442, the first end 1442 is embedded in the cathode electrode 18, and the second end 1444 is embedded in the polymer layer 142. Each carbon nanotube 144 consists of a first carbon nanotube portion, a second carbon nanotube portion, and a third carbon nanotube portion. The first carbon nanotube portion is embedded in the polymer layer 142, the second carbon nanotube portion is embedded in the insulating layer 16, and the third carbon nanotube portion is embedded in the cathode electrode 18.

The function of the insulating layer 16 is to electrically insulate the polymer layer 142 from the cathode electrode 18, thereby preventing holes generated by the exciton separation from migrating from the polymer layer 142 to the cathode electrode 18. Thus, all of the holes can migrate from the polymer layer 142 to the anode electrode 12. The insulating layer 16 can be transparent or opaque. When the surface of the cathode electrode 18 away from the insulating layer 16 is the incident surface of light, the insulating layer 16 needs to be transparent. When the second polymer surface 1424 is the incident surface of light, the insulating layer 16 can be transparent or opaque. The material of the transparent insulating layer 16 is not limited, such as polymethyl methacrylate (PMMA), polycarbonate (PC) polyperfluoroethylene propylene (FEP), or polyvinyl fluoride (PVF). The material of the opaque insulating layer 16 is not limited, such as silica gel. The main component of the silica gel is silica. In one embodiment, the material of the insulating layer 16 is PMMA.

The polymer solar cell 500 further includes a reflective layer located on the surface of the cathode electrode 18 away from the insulating layer 16, or located on the second polymer surface 1424.

The polymer solar cell 500 further includes an exciton blocking layer. The exciton blocking layer can be located between the first polymer surface 1422 and anode electrode 12. The exciton blocking layer can also be located between the photoactive layer 14 and the insulating layer 16, or between the insulating layer 16 and the cathode electrode 18. When the exciton blocking layer is located between the photoactive layer 14 and the insulating layer 16, the carbon nanotubes 144 pass through the exciton blocking layer and the insulating layer 16, to be in direct contact with the cathode electrode 18.

Both the anode electrode 12 and the cathode electrode 18 are located on the same side of the polymer layer 142 (i.e., on the first polymer surface 1422). Thus light can reach the photoactive layer 14 from the second polymer surface 1424, and accordingly, the anode electrode 12, the cathode electrode 18, and the insulating layer 16 do not have to be transparent. In addition, the conductivity in the length direction of the carbon nanotubes 144 is good, and the conductivity in the direction perpendicular to the length direction of the carbon nanotubes 144 is poor, thus when the first ends 1442 are exposed from the polymer layer 142 and the insulating layer 16 to be in direct contact with the cathode electrode 18, the electrical conductivity between the carbon nanotubes 144 and the cathode electrode 18 is improved.

Figure 13:
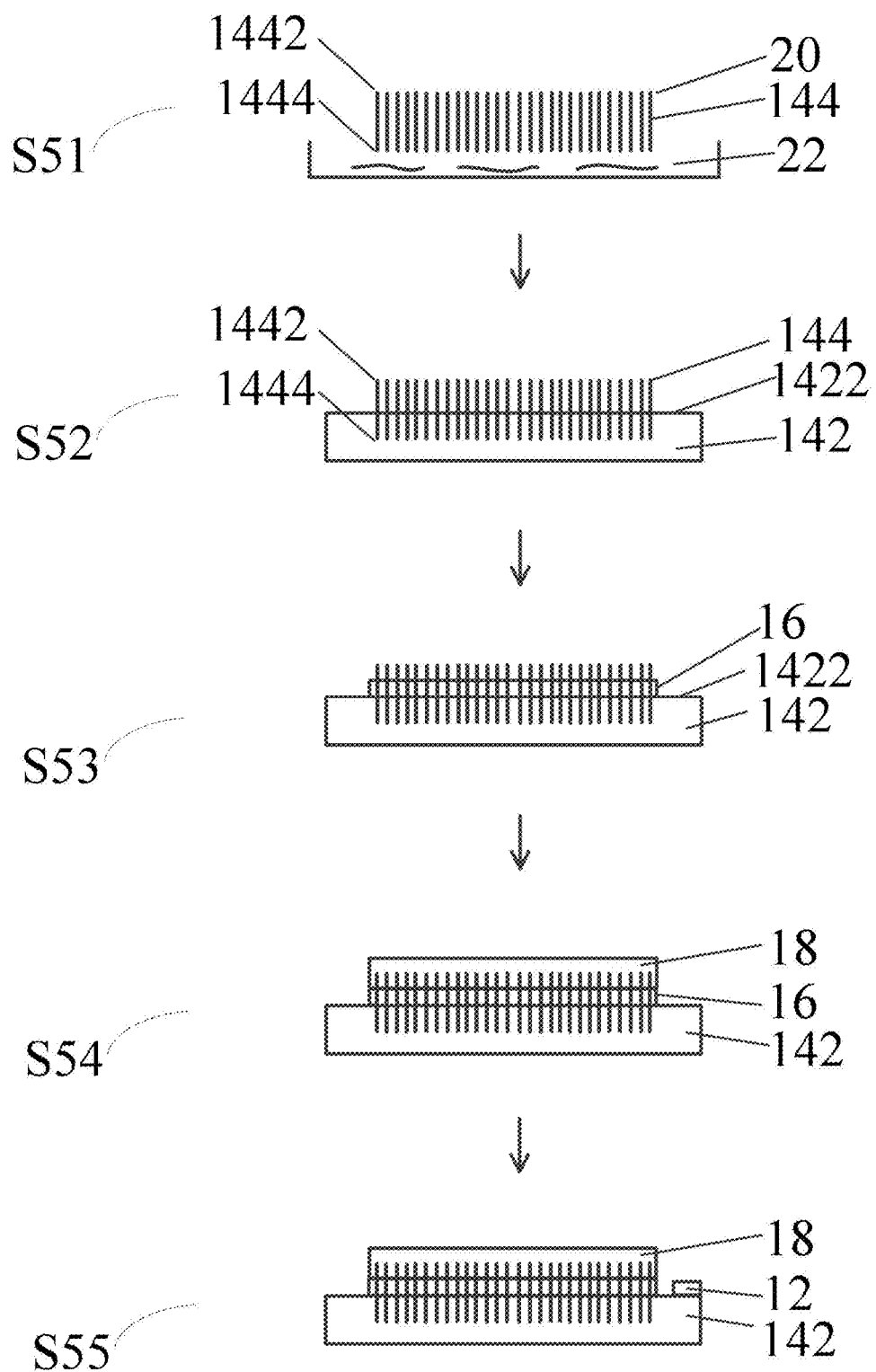
FIG. 13 is a process flow of a method for making the polymer solar cell of FIG. 12.

FIG. 13 shows the fifth embodiment of a method for making the polymer solar cell 500, and the method includes the following steps:

S51, placing a carbon nanotube array 20 into a polymer solution 22, wherein the carbon nanotube array 20 includes the plurality of carbon nanotubes 144, each of the plurality of carbon nanotubes 144 has the first end 1442 and the second end 1444 opposite to the first end 1442, the first end 1442 is exposed out of the polymer solution 22, and the second end 1444 is immersed in the polymer solution 22;

S52, curing the polymer solution 22 to form the polymer layer 142, wherein polymer layer 142 includes the first polymer surface 1422 and the second polymer surface 1424 opposite to the first polymer surface 1422, the first end 1442 is exposed out of the polymer layer 142, and the second end 1444 is embedded in the polymer layer 142;

S53, forming the insulating layer 16 on the first polymer surface 1422, wherein the first end 1442 passes through the insulating layer 16 and exposed out of the insulating layer 16;

S54, forming the cathode electrode 18 on a surface of the insulating layer 16 away from the polymer layer 142, wherein the first end 1442 is embedded in the cathode electrode 18; and S15, forming the anode electrode 12 on the first polymer surface 1422, wherein the anode electrode 12 is spaced apart from the plurality of carbon nanotubes 144.

In the step S51, the carbon nanotube array 20 has a first surface 202 and a second surface 204 opposite to the first surface 202, and the plurality of carbon nanotubes 144 extend from the first surface 202 to the second surface 204. The plurality of carbon nanotubes 144 are substantially parallel to and spaced apart from each other. The first ends 1442 of all of the carbon nanotubes 144 form the first surface 202, and the second ends 1444 of all of the carbon nanotubes 144 form the second surface 204. The length directions of the carbon nanotubes 144 are substantially perpendicular to the first surface 202. In one embodiment, the length directions of the carbon nanotubes 144 are perpendicular to the first surface 202, and the carbon nanotubes 144 are parallel to each other. The lengths of the carbon nanotubes 144 are greater than or equal to 100 nanometers. In one embodiment, the lengths of the carbon nanotubes 144 are several hundred micrometers to several hundred millimeters. In one embodiment, the lengths of the carbon nanotubes 144 are greater than or equal to 100 nanometers and less than or equal to 10 millimeters, such as 100 micrometers, 500 micrometers, 1000 micrometers, or 5 millimeters.

The method for placing the carbon nanotube array 20 into the polymer solution 22 is not limited. The present invention provides two methods, but the two methods do not limit the invention.

Figure 14:
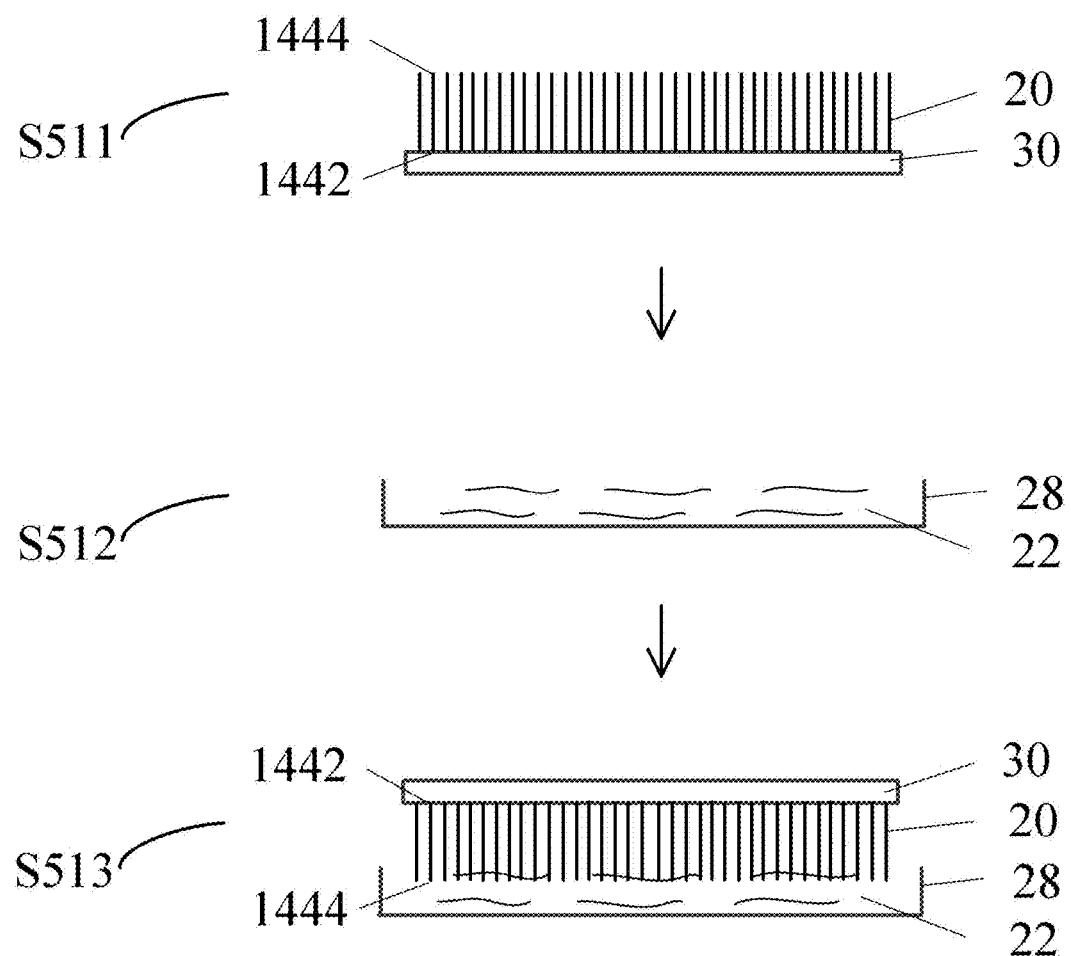
FIG. 14 is a process flow of the fifth embodiment of a method for placing a carbon nanotube array into the polymer solution.

FIG. 14 shows the fifth method for placing the carbon nanotube array 20 into the polymer solution 22, and the method includes the following steps:

S511, growing the carbon nanotube array 20 on a growth substrate 30, wherein the first end 1442 of each carbon nanotube 144 is in direct contact with the growth substrate 30, the second end 1444 of each carbon nanotube 144 is away from the growth substrate 30;

S512, placing the polymer solution 22 in a container 28; and

S513, inverting the growth substrate 30 to make a portion of each carbon nanotube 144 immersed in the polymer solution 22, wherein the second end 1444 is also immersed in the polymer solution 22.

In the step S511, the method for making the carbon nanotube array 20 includes the following steps: (a) providing a flat growth substrate 30, wherein the growth substrate 30 can be a P-type silicon wafer, an N-type silicon wafer or a silicon wafer formed with an oxidized layer thereon; and in one embodiment, a 4-inch, P-type silicon wafer is used as the growth substrate 30; (b) forming a catalyst layer on the growth substrate 30, wherein the catalyst layer is made of a material selected from the group consisting of iron (Fe), cobalt (Co), nickel (Ni), and an alloy thereof; (c) annealing the growth substrate 30 with the catalyst layer in air at a temperature in a range from 700° C. to 900° C. for about 30 minutes to about 90 minutes; (d) providing a carbon source gas at high temperature to a furnace for about 5 minutes to about 30 minutes to grow the carbon nanotube array 20 on the growth substrate 30.

In the step S513, the method for inverting the growth substrate 30 and partially immersing the carbon nanotube array 20 into the polymer solution 22 is not limited. For example, the growth substrate 30 can be fixed by a tool, such as tweezers, to invert the growth substrate 30.

It can be understood that, when the carbon nanotube array 20 is placed in the polymer solution 22 by the first method, it is necessary to further include a step of removing the growth substrate 30 before the step S13. The method for removing the growth substrate 30 is not limited, for example, the growth substrate 30 is peeled off using a tool, such as a knife, or the growth substrate 30 is etched using a laser.

Figure 15:
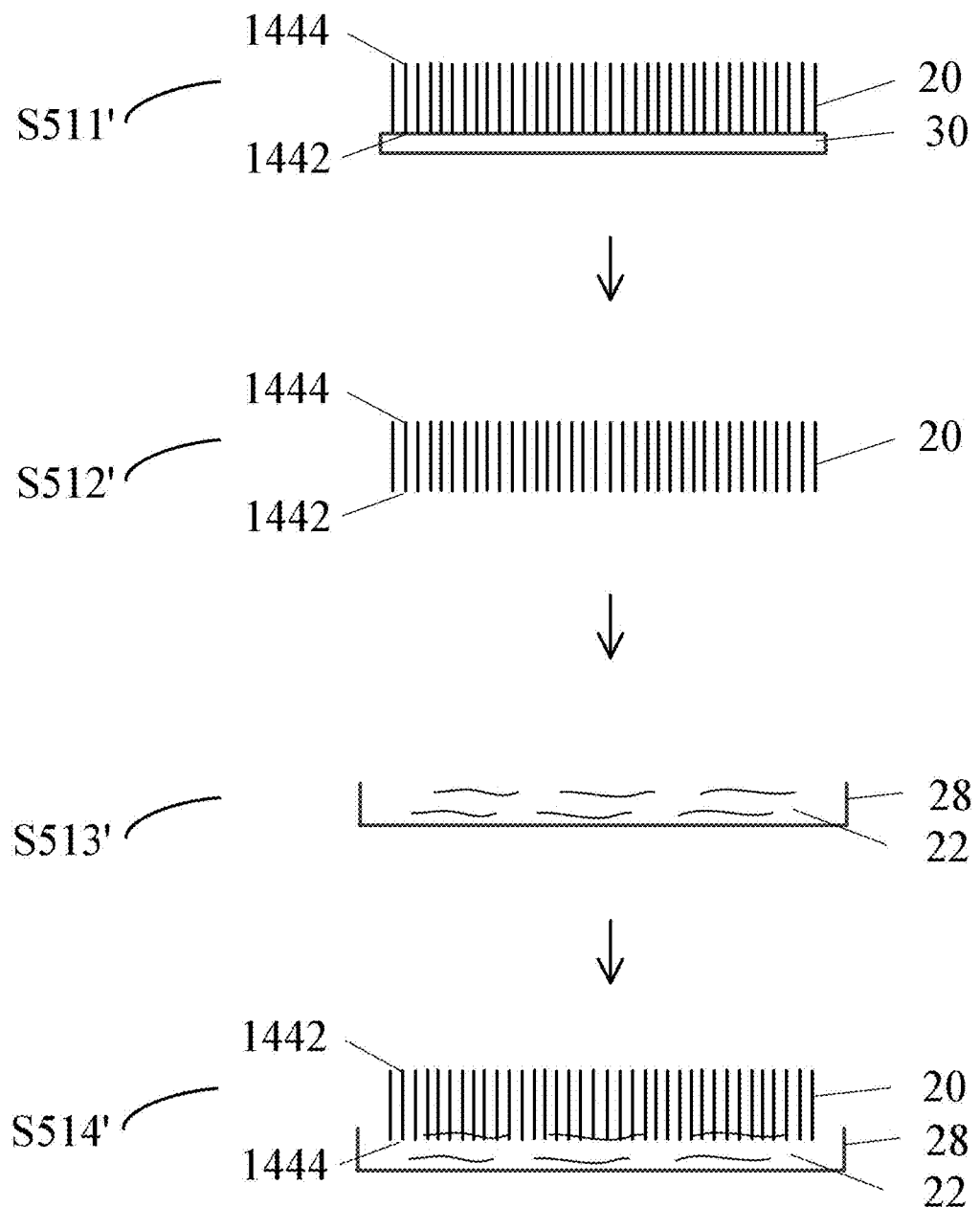
FIG. 15 is a process flow of the fifth embodiment of another method for placing the carbon nanotube array into the polymer solution.

FIG. 15 shows the second method for placing the carbon nanotube array 20 into the polymer solution 22, and the method includes the following steps:

S511', growing the carbon nanotube array 20 on a growth substrate 30, wherein the first end 1442 of each carbon nanotube 144 is in direct contact with the growth substrate 30, the second end 1444 of each carbon nanotube 144 is away from the growth substrate 30;

S512', removing the growth substrate 30;

S513', placing the polymer solution 22 in the container 28; and

S514', immersing a portion of each carbon nanotube 144 in the polymer solution 22.

In the step S512', the carbon nanotube array 20 can be totally peeled off from the growth substrate 30. In one embodiment, the carbon nanotube array 20 is totally peeled off from the growth substrate 30 by a knife or other similar tool along a direction parallel to the surface of the growth substrate 30. In the process of peeling off the carbon nanotube array 20, adjacent two of the carbon nanotubes 144 join together by van der Waals attractive force, therefore the carbon nanotube array 20 is free-standing structure. In one embodiment, two tweezers respectively clamp the two opposite sides of the carbon nanotube array 20.

The term "free-standing" includes, but not limited to, the carbon nanotube array 20 that does not have to be supported by a substrate. For example, a free-standing carbon nanotube array 20 can sustain itself when it is hoisted by a portion thereof without any significant damage to its structural integrity. So, if the free-standing carbon nanotube array 20 is placed between two separate substrates, a portion of the free-standing carbon nanotube array 20, not in contact with the two substrates, would be suspended between the two substrates and yet maintain structural integrity.

It can be understood that after curing the polymer solution 22 to form the polymer layer 142 in the step S12 and before combining the polymer layer 142 with the anode electrode 12 in the step S16, a step of removing the container 28 is needed. For example, the whole structure in the container 28 is taken out of the container 28. In addition, the method for curing the polymer solution 22 is not limited, for example, polymer solution 22 is heated to form the polymer layer 142.

In the step S53, the method for forming the insulating layer 16 is not limited. For example, the insulating layer 16 is first dissolved in a solvent to form a solution, and then the solution is sprayed or spin coated on the first polymer surface 1422 of the polymer layer 142. In one embodiment, PMMA is dissolved in the organic solvent to form a PMMA solution, and the PMMA solution is coated on the first polymer surface 1422. Then the PMMA solution penetrates into the gas between adjacent carbon nanotube 144. The height of the PMMA solution is less than the length of the carbon nanotube 144 exposed from the polymer layer 142. After curing, the PMMA solution forms a PMMA insulating layer, and the thickness of the PMMA insulating layer is less than the length of the carbon nanotube 144 exposed from the polymer layer 142. The first end 1442 of the carbon nanotube 144 passes through the PMMA insulating layer and is exposed out of the PMMA insulating layer.

In the step S54, the method for forming the cathode electrode 18 on the surface of the insulating layer 16 away from the polymer layer 142 is not limited, as sputtering, coating, vapor deposition, or spraying. A previously prepared cathode electrode 18, such as a metal piece, can be directly located on the surface of the insulating layer 16 away from the polymer layer 142. The cathode electrode 18 has a thickness such that the first end 1442 of the carbon nanotube 144 is embedded in the cathode electrode 18 and is covered by the cathode electrode 18.

In the step S54, the method for forming the anode electrode 12 on the first polymer surface 1422 is not limited, such as sputtering, coating, vapor deposition, mask etching, spraying, or inkjet printing.

Figure 16:
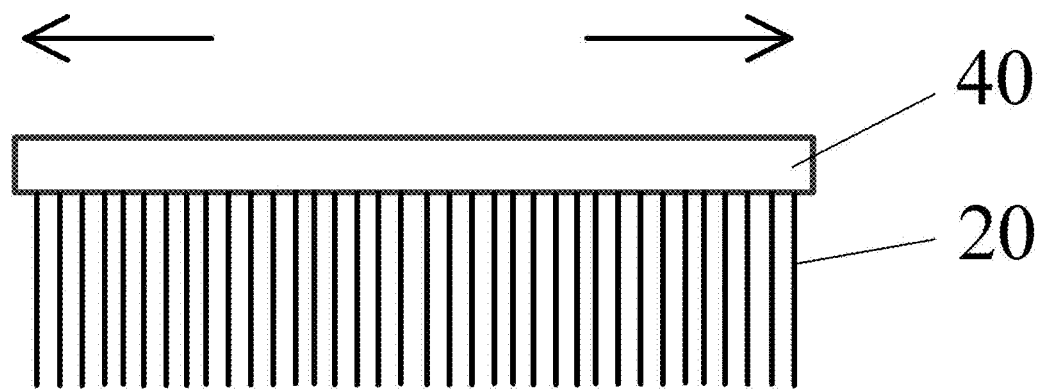
FIG. 16 schematically shows the fifth embodiment of pretreating the carbon nanotube array.

Furthermore, before curing the polymer solution 22, a step of pretreating the carbon nanotube array 20 can be included. FIG. 16 shows the method of pretreating the carbon nanotube array 20 and that includes the following steps: (1) adhering the carbon nanotube array 20 to a surface of an elastic support 40, wherein the length direction of each carbon nanotube 144 is substantially perpendicular to the surface of the elastic support 40, and the carbon nanotube array 20 is adhered to the elastic support 40 by an adhesive in one embodiment; (2) respectively pulling the two opposite ends of the elastic support 40 along opposite directions. Under the pulling force, the elastic support 40 is stretched, the carbon nanotube array 20 is also stretched, and the distance between two adjacent carbon nanotubes 144 becomes longer. The pulling speed can be selected according to the carbon nanotube array 20. If the pulling speed is too large, the carbon nanotube array 20 would be easily broken. In one embodiment, the pulling speed is less than 2 cm/s. The advantage of pretreating the carbon nanotube array 20 is: after stretching the carbon nanotube array 20, the distance between two adjacent carbon nanotubes 144 becomes longer, thus the material of the insulating layer 16 is easy to enter the gap between two adjacent carbon nanotubes 144. The elastic support 40 has better elasticity, and the shape and structure of the elastic support 40 are not limited. The elastic support 40 can be a planar structure or a curved structure. The elastic support 40 can be an elastic rubber, a rubber band, or the like. The elastic support 40 is used to support and stretch the carbon nanotube array 20. It can be understood that after pretreating the carbon nanotube array 20, a step of removing the elastic support 40 is further included.

Figure 17:
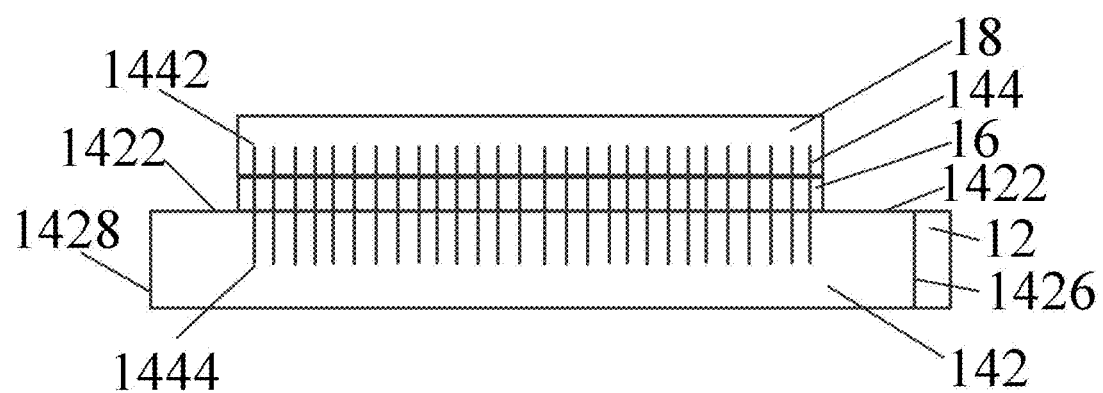
FIG. 17 schematically shows a sixth embodiment of a polymer solar cell.

FIG. 17 shows a polymer solar cell 600 of a sixth embodiment. The polymer solar cell 600 of the sixth embodiment is similar to the polymer solar cell 500 of the fifth embodiment above except that the positions of the anode electrodes 12 in the polymer solar cells 500 and 600 are different. In the polymer solar cell 500, the anode electrode 12 and the cathode electrode 18 are located on the same side of the polymer layer 142 (i.e., on the first polymer surface 1422). However, in the polymer solar cell 600, the anode electrode 12 and the cathode electrode 18 are located on different sides of the polymer layer 142. The anode electrode 12 is located on the third polymer surface 1426 or the fourth polymer surface 1428.

In the sixth embodiment, the method for making the polymer solar cell 600 is provided. The method for making the polymer solar cell 600 in the sixth embodiment is similar to the method for making the polymer solar cell 500 in the fifth embodiment above except that in the method for making the polymer solar cell 600, the anode electrode 12 is formed on the third polymer surface 1426 or the fourth polymer surface 1428.

Figure 18:
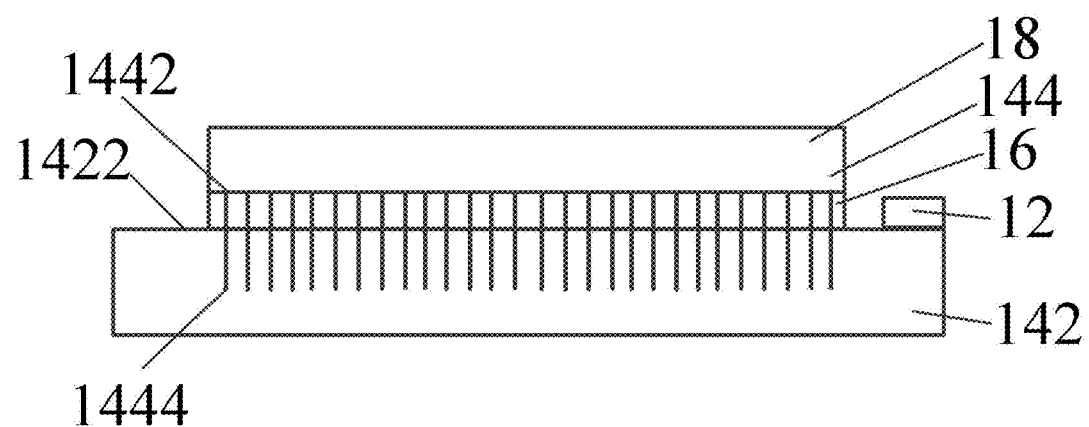
FIG. 18 schematically shows a seventh embodiment of a polymer solar cell.

FIG. 18 shows a polymer solar cell 700 of a seventh embodiment. The polymer solar cell 700 of the seventh embodiment is similar to the polymer solar cell 500 of the fifth embodiment above except that in the polymer solar cell 700, the first end 1442 of the carbon nanotube 144 is flush with the surface of the insulating layer 16 away from the polymer layer 142; and the first end 1442 of the carbon nanotube 144 is in direct contact with the surface of the cathode electrode 18, and is not embedded into the interior of the cathode electrode 18.

In the seventh embodiment, the method for making the polymer solar cell 700 is provided. The method for making the polymer solar cell 700 in the seventh embodiment is similar to the method for making the polymer solar cell 500 in the fifth embodiment above except that the insulating layer 16 is formed by sputtering, coating, vapor deposition, mask etching, spraying, or inkjet printing, the insulating layer 16 covers the carbon nanotube 144, but the first end 1442 of carbon nanotube 144 is exposed, and the first end 1442 is flush with the surface of the insulating layer 16 away from the polymer layer 142. Because the first end 1442 is flush with the surface of the insulating layer 16 away from the polymer layer 142, the cathode electrode 18 is located on the insulating layer 16 away from the polymer layer 142, the first end 1442 is in direct contact with the surface of the cathode electrode 18 and is not embedded into the interior of the cathode electrode 18.

Figure 19:
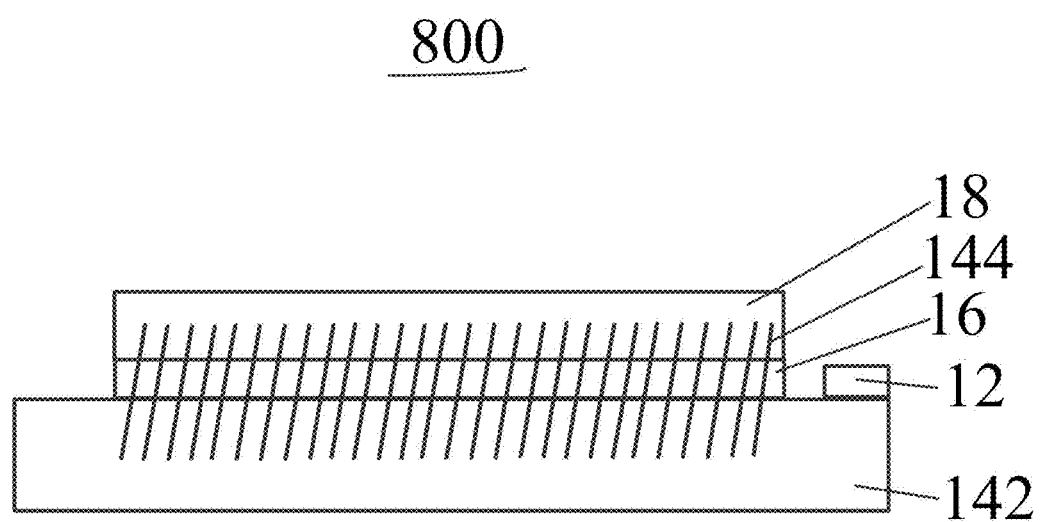
FIG. 19 schematically shows an eighth embodiment of a polymer solar cell.

FIG. 19 shows a polymer solar cell 800 of an eighth embodiment. The polymer solar cell 800 of the eighth embodiment is similar to the polymer solar cell 500 of the fifth embodiment above except that the arrangement of the carbon nanotubes 144. In the polymer solar cell 500 of the fifth embodiment, the length directions of the carbon nanotubes 144 is substantially perpendicular to the first polymer surface 1422 of the polymer layer 142. In the polymer solar cell 800 of the eighth embodiment, the length directions of the carbon nanotubes 144 and the first polymer surface 1422 form an angle that is greater than 0 degrees and less than 90 degrees. In one embodiment, the angle is greater than 30 degrees and less than 60 degrees. The advantage of the polymer solar cell 800 is: the carbon nanotubes 144 are tilted in the polymer layer 142, thus the surface of the carbon nanotubes 144 (acceptor) in contact with the polymer layer 142 (donor) is increased. It is beneficial for separating more excitons into electrons and holes. Thus, the photoelectric conversion efficiency of the polymer solar cell 800 is improved.

In the eighth embodiment, the method for making the polymer solar cell 800 is provided. The method for making the polymer solar cell 800 in the eighth embodiment is similar to the method for making the polymer solar cell 500 in the fifth embodiment above except that the method for making the polymer solar cell 800 further includes a step of pressing the carbon nanotube array 20 before curing the polymer solution 22. The carbon nanotube array 20 can be pressed by a pressing device, such that the carbon nanotubes 144 are tilted. The degree of inclination of the carbon nanotubes 144 can be controlled by controlling the pressure, such that the angle of grater than 0 degrees and less than 90 degrees is formed between the first polymer surface 1422 and the carbon nanotubes 144.

FIG. 20-FIG. 23 show a polymer solar cell 900 of a ninth embodiment. The polymer solar cell 900 of the ninth embodiment is similar to the polymer solar cell 100 of the first embodiment above except that the shapes of the anode electrode 12 and the cathode electrode 18.

Figure 21:
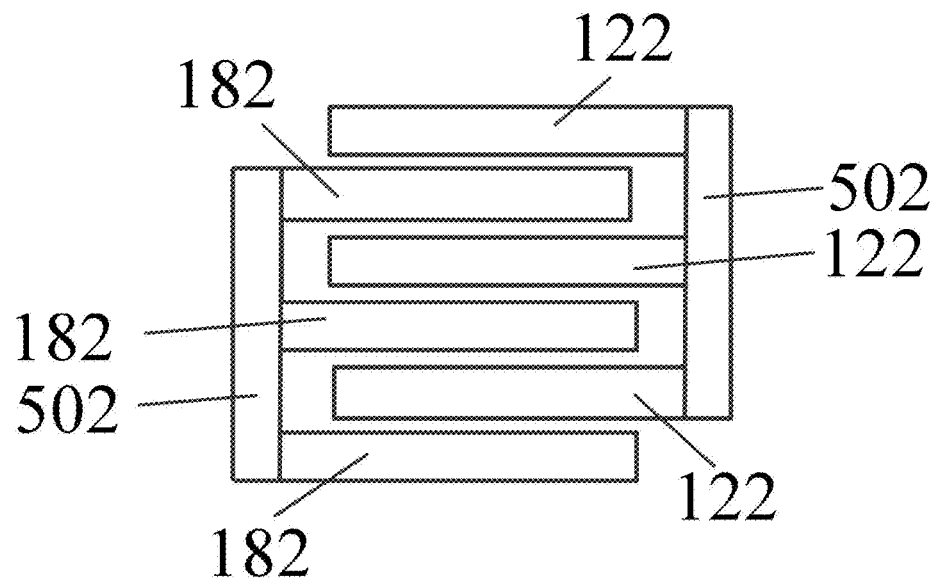
FIG. 21 is a view of a ninth embodiment of a composite structure formed by the anode electrode and a cathode electrode.

In the polymer solar cell 900, the carbon nanotube layer 143 exposed from the polymer layer 142 includes a plurality of sub-carbon nanotube layers 1432, the anode electrode 12 includes a plurality of sub-anode electrodes 122, and the cathode electrode 18 includes a plurality of sub-cathode electrodes 182. The plurality of sub-anode electrodes 122 and the plurality of sub-cathode electrodes 182 are spaced apart from each other and alternately disposed on the first polymer surface 1422. The plurality of sub-anode electrodes 122 are electrically connected to each other, and the plurality of sub-cathode electrodes 182 are electrically connected to each other. In one embodiment, the plurality of sub-anode electrodes 122 are electrically connected by the connection portion 502, and the plurality of sub-cathode electrodes 182 are electrically connected by the connection portion 502, as shown in FIG. 21. The connection portion 502 is made of a conductive material, such as metal or the like. The plurality of sub-anode electrodes 122 can be integrally formed with the connection portions 502, and the plurality of sub-cathode electrodes 182 can be integrally formed with the connection portions 502, to form comb-teeth electrodes.

Figure 20:
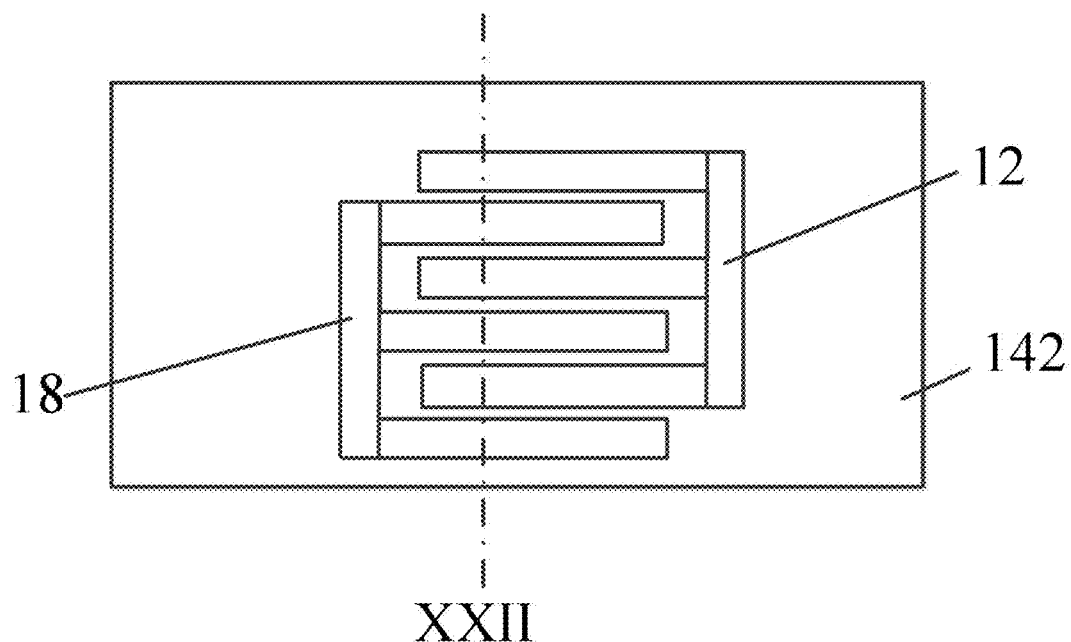
FIG. 20 schematically shows a ninth embodiment of a polymer solar cell.
Figure 22:
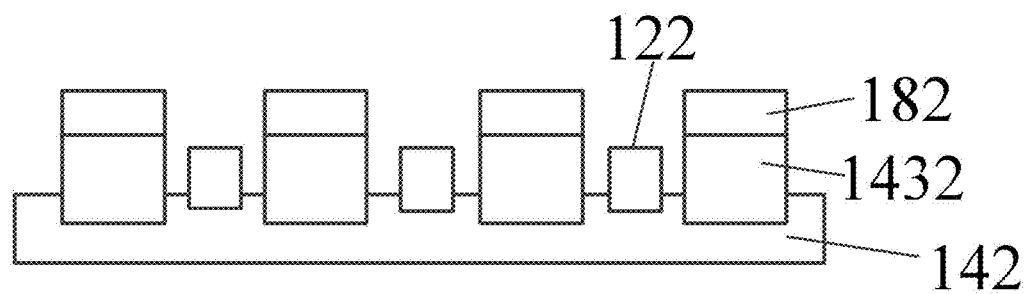
FIG. 22 schematically shows along XXII-XXII line of FIG. 20.

FIG. 22 is a schematic view of along XXII-XXII line of FIG. 20. In order to clearly show the positional relationship between the sub-carbon nanotube layer 1432, the sub-anode electrode 122, and the sub-cathode electrode 182, the connection portions 502 are omitted in the FIG. 22. FIG. 22 shows the carbon nanotube layer 143 exposed from the polymer layer 142 and that includes the plurality of sub-carbon nanotube layer 1432 spaced apart from each other, each sub-cathode electrode 182 is located on a surface of the sub-carbon nanotube layer 1432 away from the polymer layer 142. The plurality of sub-carbon nanotube layer 1432 and the plurality of sub-anode electrodes 122 are spaced apart from each other and alternately disposed on the first polymer surface 1422. It can be understood that in order to make the sub-anode electrode 122 be spaced apart from the carbon nanotube layer 143, some portions of the polymer layer 142 are etched so that the first polymer surface 1422 is uneven, as shown in FIG. 22.

Figure 23:
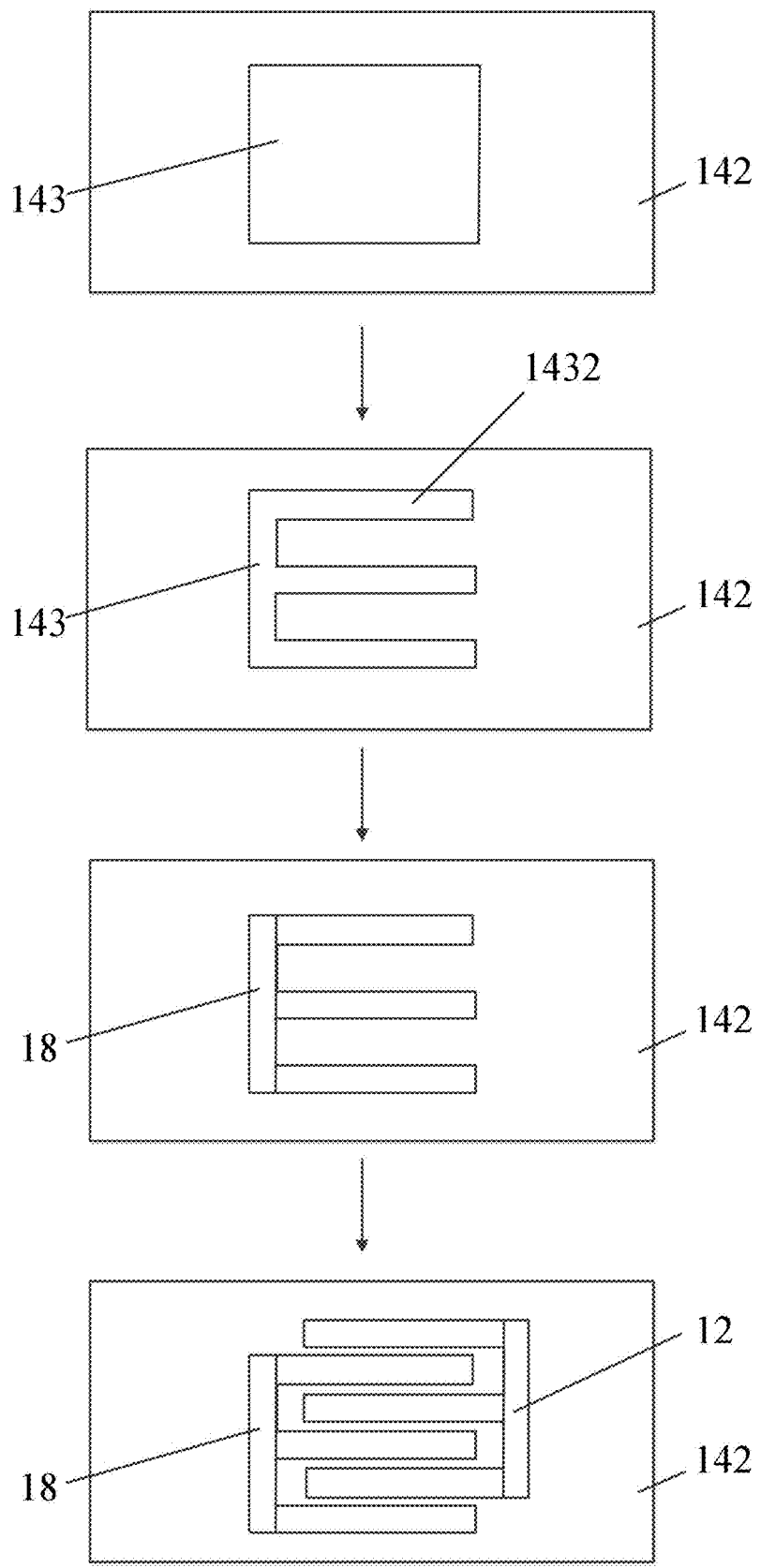
FIG. 23 is a process flow of a method for making the polymer solar cell of FIG. 20.

FIG. 23 shows the ninth embodiment of the method for making the polymer solar cell 900. The method for making the polymer solar cell 900 in the ninth embodiment is similar to the method for making the polymer solar cell 100 in the first embodiment above except that the carbon nanotube layer 143 exposed from the polymer layer 142 is patterned.

After curing the polymer solution 22 to form the polymer layer 142, the carbon nanotube layer 143 exposed from the polymer layer 142 is patterned to form the plurality of sub-carbon nanotube layer 1432 spaced apart from each other. Then, the sub-cathode electrode 182 is formed on the surface of each sub-carbon nanotube layer 1432 away from the polymer layer 142, and the sub-anode electrode 122 is formed between two adjacent sub-carbon nanotube layer 1432. The sub-anode electrode 122 is spaced apart from the sub-carbon nanotube layer 1432. The cathode electrode 18 and the carbon nanotube layer 143 exposed from the polymer layer 142 have the same shape.

The polymer solar cells 100 to 900 have the following advantages: 1) the carbon nanotubes 144 are exposed from the polymer layer 142 to be in direct contact with the cathode electrode 18, improving the electrical conductivity between the carbon nanotubes 144 and the cathode electrode 18; 2) the carbon nanotubes 144 of the drawn carbon nanotube film, the flocculated carbon nanotube film, the pressed carbon nanotube film, or the carbon nanotube array 20 are aligned themselves, and it is no longer necessary to orient the carbon nanotubes 144 by external force, such as a magnetic field; 3) both the anode electrode 12 and cathode electrode 18 can be opaque or transparent.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. A method for making a polymer solar cell, comprising:
   placing a portion of a carbon nanotube layer into a polymer solution, wherein the carbon nanotube layer comprises a plurality of carbon nanotubes;
   curing the polymer solution to form a polymer layer comprising a first polymer surface and a second polymer surface opposite to the first polymer surface, wherein the portion of the carbon nanotube layer is embedded in the polymer layer, and another portion of the carbon nanotube layer is not embedded in the polymer layer and exposed from the first polymer surface of the polymer layer; and
   forming a cathode electrode on a surface of the carbon nanotube layer away from the polymer layer, and forming an anode electrode on the first polymer surface, wherein the anode electrode is spaced apart from the carbon nanotube layer.

2. The method of claim 1, wherein length directions of the plurality of carbon nanotubes are parallel to the first polymer surface.

3. The method of claim 1, wherein the plurality of carbon nanotubes entangled with each other.

4. The method of claim 1, wherein the plurality of carbon nanotubes are substantially parallel to each other.

5. The method of claim 1, wherein after curing the polymer solution, length directions of the plurality of carbon nanotubes are substantially perpendicular to the first polymer surface.

6. The method of claim 5, further comprising forming an insulating layer on the first polymer surface after curing the polymer solution and before forming the cathode electrode, wherein each of the plurality of carbon nanotubes is exposed from the polymer layer and passes through the insulating layer to be in direct contact with the cathode electrode.

7. The method of claim 5, further comprising pressing the carbon nanotube layer to tilt the plurality of carbon nanotubes before curing the polymer solution.

8. The method of claim 5, further comprising pretreating the carbon nanotube layer before curing the polymer solution, wherein the pretreating the carbon nanotube layer comprises following sub-steps:
adhering the carbon nanotube layer to a surface of an elastic support, wherein the length directions of the plurality of carbon nanotubes are substantially perpendicular to the surface of the elastic support; and
respectively pulling two opposite ends of the elastic support along opposite directions.

9. The method of claim 1, further comprising patterning the portion of the carbon nanotube layer exposed from the polymer layer after curing the polymer solution, to form a plurality of sub-carbon nanotube layers spaced apart from each other, and the forming the anode electrode comprises forming a sub-anode electrode between two adjacent sub-carbon nanotube layers.

10. The method of claim 1, further comprising forming a reflective layer located on a surface of the cathode electrode away from the carbon nanotube layer after forming the cathode electrode.

11. The method of claim 1, further comprising forming a reflective layer located on the second polymer surface after curing the polymer layer.

12. The method of claim 1, further comprising forming an exciton blocking layer on a surface of the carbon nanotube layer away from the polymer layer after curing the polymer solution, and then forming the cathode electrode on a surface of the exciton blocking layer away from the carbon nanotube layer.

13. A method for making a polymer solar cell, comprising:
placing a portion of a carbon nanotube layer into a polymer solution, wherein the carbon nanotube layer comprises a plurality of carbon nanotubes;
curing the polymer solution to form a polymer layer comprising a first polymer surface, a second polymer surface opposite to the first polymer surface, and a polymer side surface connected to the first polymer surface and the second polymer surface, wherein the portion of the carbon nanotube layer is embedded in the polymer layer, and another portion of the carbon nanotube layer is exposed from the first polymer surface of the polymer layer; and
forming a cathode electrode on a surface of the carbon nanotube layer away from the polymer layer, and forming an anode electrode on the polymer side surface, wherein the anode electrode is spaced apart from the carbon nanotube layer.

14. The method of claim 13, wherein the anode electrode is a ring to surround entire side surface of the polymer layer.

15. The method of claim 13, wherein after curing the polymer solution, length directions of the plurality of carbon nanotubes are parallel to the first polymer surface.

16. The method of claim 13, wherein after curing the polymer solution, length directions of the plurality of carbon nanotubes are substantially perpendicular to the first polymer surface.

17. The method of claim 16, further comprising forming an insulating layer on the first polymer surface after curing the polymer solution and before forming the cathode electrode, wherein each of the plurality of carbon nanotubes is exposed from the polymer layer and passes through the insulating layer to be in direct contact with the cathode electrode.

18. The method of claim 16, further comprising pressing the carbon nanotube layer to tilt the plurality of carbon nanotubes before curing the polymer solution.

19. The method of claim 16, further comprising pretreating the carbon nanotube layer before curing the polymer solution, wherein the pretreating the carbon nanotube layer comprises following sub-steps:
adhering the carbon nanotube layer to a surface of an elastic support, wherein the length directions of the plurality of carbon nanotubes are substantially perpendicular to the surface of the elastic support; and
respectively pulling two opposite ends of the elastic support along opposite directions.

20. A method for making a polymer solar cell, comprising:
placing a portion of a carbon nanotube layer into a polymer solution, wherein the carbon nanotube layer comprises a plurality of carbon nanotubes;
curing the polymer solution to form a polymer layer comprising a first polymer surface and a second polymer surface opposite to the first polymer surface, wherein the portion of the carbon nanotube layer is embedded in the polymer layer, and another portion of the carbon nanotube layer is not embedded in the polymer layer and exposed from the first polymer surface of the polymer layer; and
forming a cathode electrode on a surface of the carbon nanotube layer away from the polymer layer, and forming an anode electrode on the first polymer surface, wherein the anode electrode is spaced apart from the carbon nanotube layer, and the cathode electrode and the anode electrode are located on the same side of the polymer layer.

* * * * *